US012181928B2

(12) United States Patent
Chen

(10) Patent No.: US 12,181,928 B2
(45) Date of Patent: Dec. 31, 2024

(54) PORTABLE ELECTRONIC DEVICE

(71) Applicant: Acer Incorporated, New Taipei (TW)

(72) Inventor: Yen-Chun Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 111 days.

(21) Appl. No.: 18/187,674

(22) Filed: Mar. 22, 2023

(65) Prior Publication Data
US 2023/0305599 A1    Sep. 28, 2023

(30) Foreign Application Priority Data

Mar. 24, 2022    (TW) .................................. 111111075

(51) Int. Cl.
*G06F 1/16*    (2006.01)
*H04M 1/02*    (2006.01)
*H05K 5/02*    (2006.01)

(52) U.S. Cl.
CPC ........... *G06F 1/166* (2013.01); *H05K 5/0234* (2013.01); *G06F 1/1615* (2013.01); *G06F 1/1616* (2013.01); *G06F 1/1624* (2013.01); *H04M 1/0235* (2013.01); *H04M 1/0237* (2013.01); *H04M 1/0241* (2013.01)

(58) Field of Classification Search
CPC .............. H05K 5/0234; H04M 1/0235; H04M 1/0237; H04M 1/0241; G06F 1/166; G06F 1/1615; G06F 1/1616; G06F 1/1624; F16M 13/005; F16M 2200/021; F16M 2200/024
See application file for complete search history.

(56) References Cited

U.S. PATENT DOCUMENTS

| 7,363,065 B2 * | 4/2008 | Lee ...................... H04M 1/0245 455/90.3 |
| 8,102,675 B2 * | 1/2012 | Kilpinen ............... G06F 1/1675 361/755 |
| 10,976,775 B1 * | 4/2021 | Cha ........................ H05K 7/1401 |
| 11,301,005 B2 * | 4/2022 | Huang .................. G06F 1/1618 |
| 2005/0064921 A1 * | 3/2005 | Jeong .................. H04M 1/0245 455/575.4 |

(Continued)

FOREIGN PATENT DOCUMENTS

| CN | 211506307 | 9/2020 |
| KR | 20110115249 A | * 10/2011 |

(Continued)

*Primary Examiner* — Nidhi Thaker
(74) *Attorney, Agent, or Firm* — JCIPRNET

(57) ABSTRACT

A portable electronic device including a first body, a driving source, a stand, a second body and a magnetic driven component is provided. The driving source is disposed in the first body and includes a motor and a screw rod coupled to the motor. The screw rod has a magnetic screw thread portion. The stand is pivoted to the first body, and the second body is pivoted to the stand. The magnetic driven component is disposed at a side of the second body and the magnetic driven component is magnetically attracted to the magnetic screw thread portion of the screw rod. The motor drives the screw rod to rotate and the magnetic screw thread portion drives the magnetic driven component slide on the first body. The second body and the magnetic driven component move synchronously and drive the stand rotate with respect to the first body.

10 Claims, 4 Drawing Sheets

(56) References Cited

U.S. PATENT DOCUMENTS

| | | | | |
|---|---|---|---|---|
| 2010/0151909 A1* | 6/2010 | Zhou | .................... | H04M 1/0237 |
| | | | | 455/563 |
| 2012/0047686 A1* | 3/2012 | Hautamaki | ........... | G06F 1/1681 |
| | | | | 16/366 |
| 2013/0010431 A1* | 1/2013 | Ogatsu | .................. | G06F 1/1624 |
| | | | | 361/727 |
| 2016/0230924 A1 | 8/2016 | Chen et al. | | |
| 2016/0334052 A1* | 11/2016 | Wu | ......................... | G06F 1/166 |

FOREIGN PATENT DOCUMENTS

| | | | | | | |
|---|---|---|---|---|---|---|
| KR | | 20120011144 A | * | 2/2012 | | |
| KR | | 20240038524 A | * | 3/2024 | | |
| KR | | 20240050891 A | * | 4/2024 | | |
| WO | WO-2011159009 A1 | * | 12/2011 | .......... | H04M 1/0237 |
| WO | WO-2022186525 A1 | * | 9/2022 | | |
| WO | WO-2023213079 A1 | * | 11/2023 | | |

\* cited by examiner

PORTABLE ELECTRONIC DEVICE

CROSS-REFERENCE TO RELATED APPLICATION

This application claims the priority benefit of Taiwan application serial no. 111111075, filed on Mar. 24, 2022. The entirety of the above-mentioned patent application is hereby incorporated by reference herein and made a part of this specification.

BACKGROUND

Technical Field

The disclosure relates to an electronic device, and in particular to a portable electronic device.

Description of Related Art

Notebook computers have become an indispensable tool for modern people because of their high computing performance, multitasking, and easy portability. Generally speaking, a notebook computer is composed of a first body and a second body that are pivotally connected to each other, wherein the first body can be a host with logic computing capability, and the second body can be a display. The second body is rotatable relative to the first body to switch between the closed state and the expanded state.

In order to provide various operation modes or viewing modes, a design in which the second body is pivotally connected to the first body through a stand is proposed. Specifically, the stand is pivotally connected to the first body, and the second body is pivotally connected to the stand. Through the rotation of the second body relative to the stand and the rotation of the stand relative to the first body, the user can switch between various operation modes or viewing modes. As for the common design, the user must manually operate the second body or the stand to rotate the second body relative to the stand, or to rotate the stand relative to the first body, so the operation convenience is not good.

SUMMARY

The present invention provides a portable electronic device with excellent operational convenience.

A portable electronic device including a first body, a driving source, a stand, a second body and a magnetic driven component is provided. The driving source is disposed in the first body and includes a motor and a screw rod coupled to the motor. The screw rod has a magnetic screw thread portion. The stand is pivoted to the first body, and the second body is pivoted to the stand. The magnetic driven component is disposed at a side of the second body and the magnetic driven component is magnetically attracted to the magnetic screw thread portion of the screw rod. The motor drives the screw rod to rotate and the magnetic screw thread portion drives the magnetic driven component slide on the first body. The second body and the magnetic driven component move synchronously and drive the stand rotate with respect to the first body.

Based on the above, the portable electronic device of the present invention is integrated with an automatic lifting mechanism to drive the second body and the stand to raise or lower relative to the first body synchronously, so it has excellent operational convenience.

In order to make the above-mentioned features and advantages of the present application more obvious and easier to understand, the following specific examples are given, and are described in detail as follows in conjunction with the accompanying drawings.

DESCRIPTION OF THE EMBODIMENTS

Figure 1A:
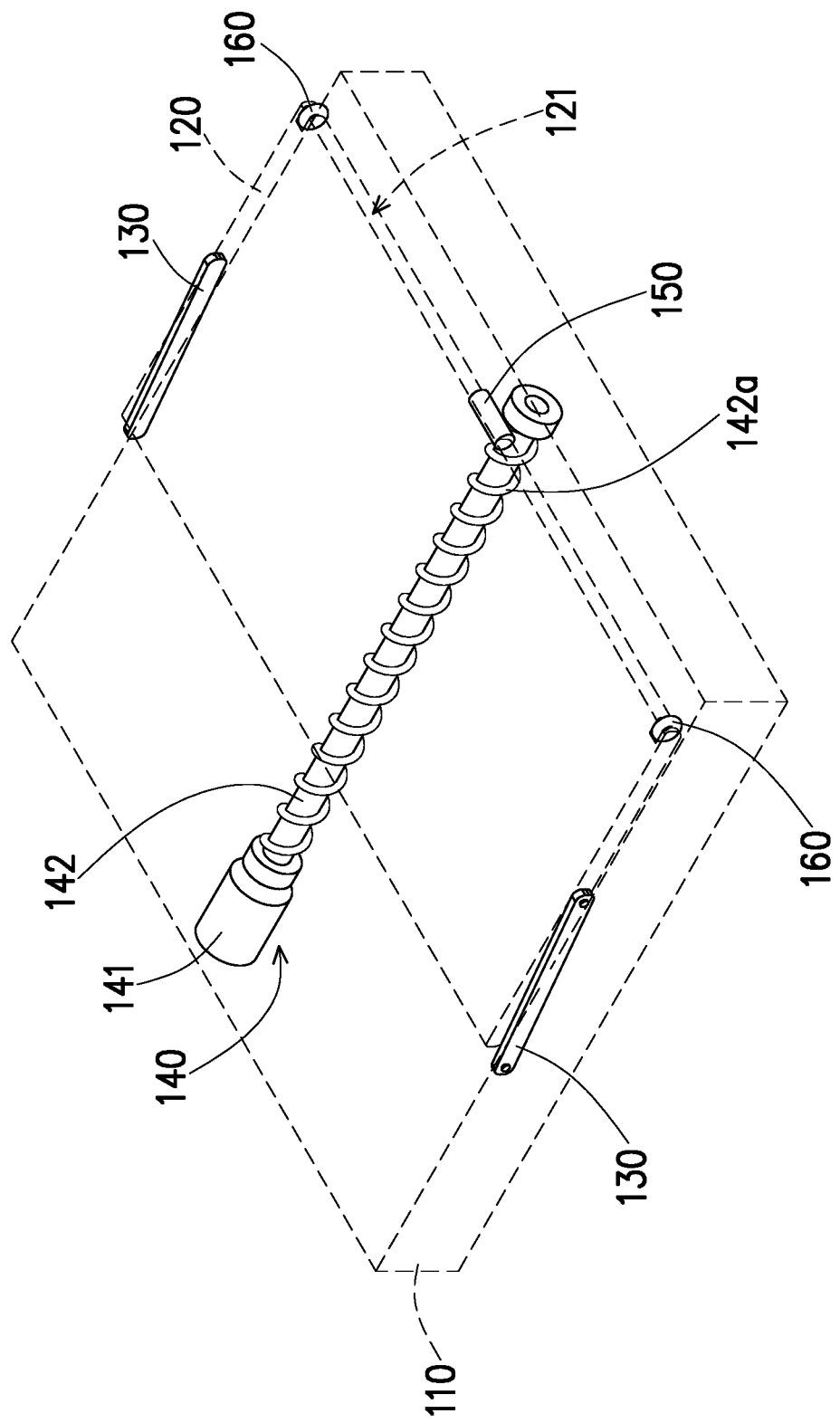
FIG. 1A is a schematic diagram of a portable electronic device according to a first embodiment of the present invention.
Figure 1B:
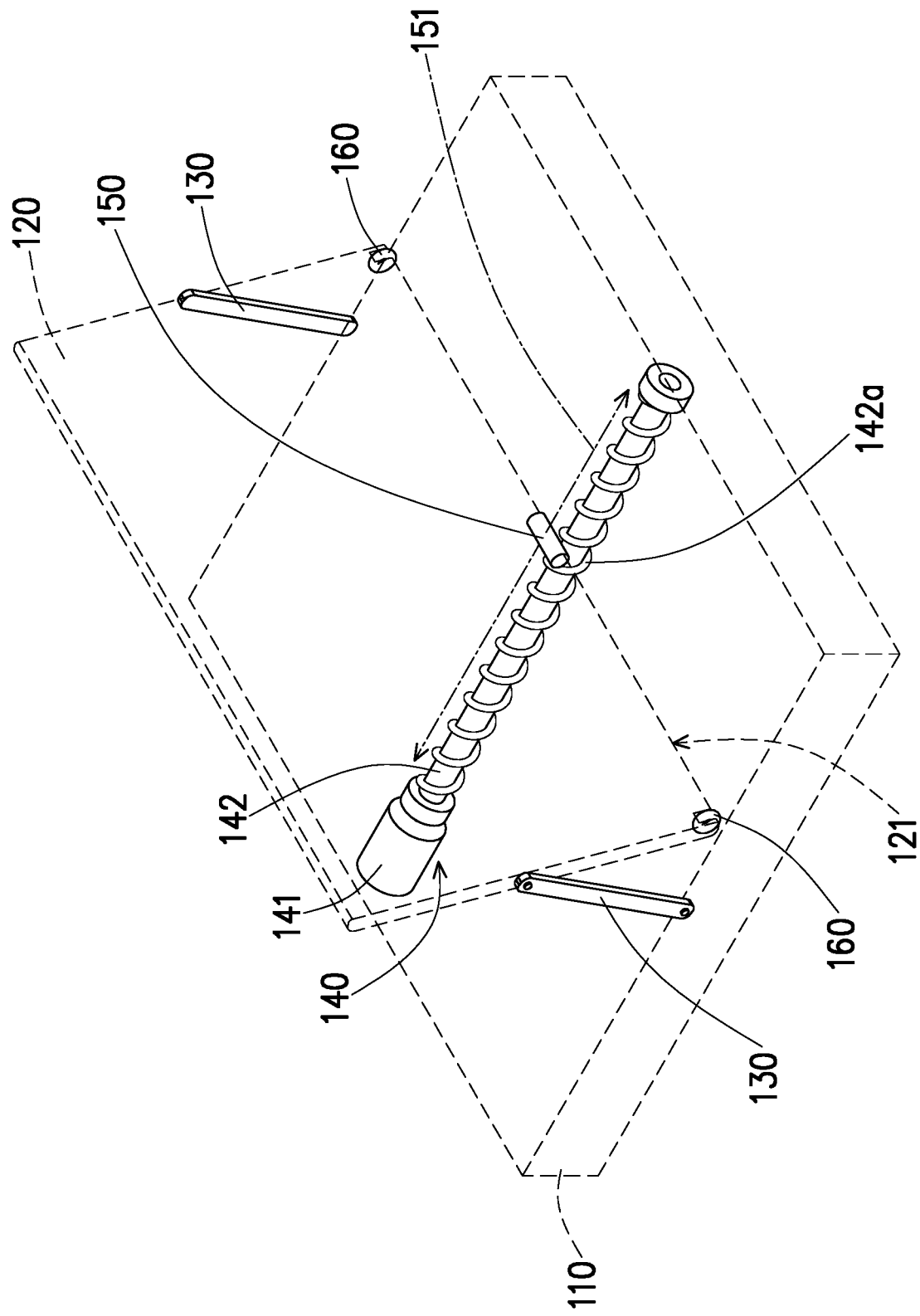
FIG. 1B is a schematic diagram of the portable electronic device of FIG. 1A being converted to a raised state.

FIG. 1A is a schematic diagram of a portable electronic device according to a first embodiment of the present invention. FIG. 1B is a schematic diagram of the portable electronic device of FIG. 1A being converted to a raised state. The first body 110 and the second body 120 in the drawings are drawn with dotted lines to clearly present the driving source 140 disposed inside the first body 110. Referring to FIG. 1A and FIG. 1B, in the embodiment, the portable electronic device 100 can be a notebook computer, and includes a first body 110, a second body 120 and a stand 130. The first body 110 can be a host with logic computing capability, and the second body 120 can be a display. The stand 130 is pivotally connected to the first body 110, and the second body 120 is pivotally connected to the stand 130. The number of the stand 130 can be two, and the stand 130 are arranged on both sides of the second body 120 in pairs.

In an operation mode, the stand 130 rotates relative to the first body 110 and drives the second body 120 to move synchronously. In another operation mode, the second body 120 slides relative to the first body 110 and drives the stand 130 to move synchronously. In yet another operation mode, the second body 120 rotates relative to the stand 130, and the stand 130 can move synchronously with the second body 120 or remain stationary. Therefore, the portable electronic device 100 can provide various operation modes or viewing modes.

In order to improve the convenience of the user's operation, the portable electronic device 100 is integrated with an automatic lifting mechanism to drive the second body 120 and the stand 130 to raise or lower relative to the first body 110 synchronously. Specifically, the automatic lifting mechanism includes a driving source 140 and a magnetic driven component 150, wherein the driving source 140 is disposed in the first body 110, and the magnetic driven component 150 is fixed on the side 121 of the second body 120. The magnetic driven component 150 contacts the first body 110 and is disposed corresponding to the driving source 140. The magnetic driven component 150 is magnetically attracted to the driving source 140 to maintain the coupling relationship. When the driving source 140 outputs power, the driving source 140 drives the magnetic driven component 150 to slide on the first body 110 along a linear direction. On the other hand, the second body 120 moves synchronously with the magnetic driven component 150 and drives the stand 130 to rotate relative to the first body 110 to automatically switch the operation mode or viewing mode of the portable electronic device 100.

During the process of the second body 120 and the stand 130 move up and down relative to the first body 110 synchronously, the magnetic driven component 150 maintains contact with the first body 110, and the side 121 of the second body 120 faces the first body 110. Since the magnetic driven component 150 and the driving source 140 maintain the coupling relationship with the magnetic attraction mechanism, the user can quickly release the coupling relationship between the magnetic driven component 150 and the driving source 140 according to operation requirements. That is to say, the user can apply force to the second body 120 to move the side 121 of the second body 120 and the magnetic driven component 150 away from the first body 110. During this process, the second body 120 rotates relative to the stand 130, and the stand 130 can move synchronously with the second body 120 or remain stationary.

Since the coupling relationship between the driven component 150 and the driving source 140 is not a mechanical connection. That is, there is no mechanical interference between the driven component 150 and the driving source 140. Therefore, when the user tilts or depresses the second body 120, the coupling relationship between the driven component 150 and the driving source 140 can be automatically released without forcibly destroying the mechanical interference and causing damage to the mechanism.

Referring to FIG. 1A and FIG. 1B. in the embodiment, the driving source 140 includes a motor 141 and a screw rod 142 coupled to the motor 141, and the screw rod 142 has a magnetic screw thread portion 142a. The magnetic screw thread portion 142a is a helical structure on the screw rod 142 and extends from one end of the screw rod 142 away from the motor 141 to the other end of the screw rod 142 close to the motor 141. The magnetic driven component 150 is magnetically attracted to the magnetic screw thread portion 142a. Therefore, the sliding stroke of the magnetic driven component 150 on the first body 110 can be determined by the extension range of the magnetic screw thread portion 142a. On the other hand, the sliding path 151 of the magnetic driven component 150 on the first body 110 overlaps with the screw rod 142.

For example, both the magnetic screw thread portion 142a and the magnetic driven component 150 can be made of magnets, and they attract each other. Alternatively, the magnetic screw thread portion 142a is made of a magnet, and the magnetic driven component 150 is made of a magnetic material that can be attracted by the magnet. Alternatively, the magnetic driven component 150 is made of a magnet, and the magnetic screw thread portion 142a is made of a magnetic material that can be attracted by the magnet.

When the motor 141 drives the screw rod 142 to rotate around the first direction, the magnetic screw thread portion 142a drives the magnetic driven component 150 to slide on the first body 110 along the linear direction. And the second body 120 moves synchronously with the magnetic driven component 150 and drives the stand 130 to rotate relative to the first body 110. During this process, the second body 120 and the stand 130 are raised relative to the first body 110, for example, from the state shown in FIG. 1A to the state shown in FIG. 1B.

When the motor 141 drives the screw rod 142 to rotate in a second direction opposite to the first direction, the magnetic screw thread portion 142a drives the magnetic driven component 150 to slide on the first body 110 along the linear direction. And the second body 120 moves synchronously with the magnetic driven component 150 and drives the stand 130 to rotate relative to the first body 110. During this process, the second body 120 and the stand 130 are lowered relative to the first body 110, for example, from the state shown in FIG. 1B is switched to the state shown in FIG. 1A.

For example, the user can control the switch of the motor 141 through a physical switch or an application program.

Referring to FIG. 1A and FIG. 1B, in the embodiment, the portable electronic device 100 further includes a guide wheel 160, wherein the guide wheel 160 is arranged on the side 121 of the second body 120. The magnetic driven component 150 and the guide wheel 160 contact the first body 110 together, so as to improve the sliding smoothness of the second body 120 and the magnetic driven component 150 on the first body 110. The guide wheel 160 moves synchronously with the second body 120 and the magnetic driven component 150. When the magnetic driven component 150 contacts the first body 110 and slides on the first body 110, the guide wheel 160 also contacts the first body 110 to provide support for the second body 120 and can rotate relative to the second body 120 to reduce frictional resistance. For example, the number of the guide wheels 160 can be two, and they are symmetrically arranged on both sides of the magnetic driven component 150. In other embodiments, the number and location of the guide wheels 160 can be adjusted according to design requirements.

In other embodiments, the guide wheel 160 is fixed on the side 121 of the second body. When the magnetic driven component 150 contacts the first body 110 and slides on the first body 110, the guide wheel 160 also contacts the first body 110 to provide a supporting force to the second body 120. For example, the guide wheel 160 may be made of a material with a low coefficient of friction or its outer surface may be covered with a material with a low coefficient of friction, thereby helping to reduce frictional resistance.

Figure 2:
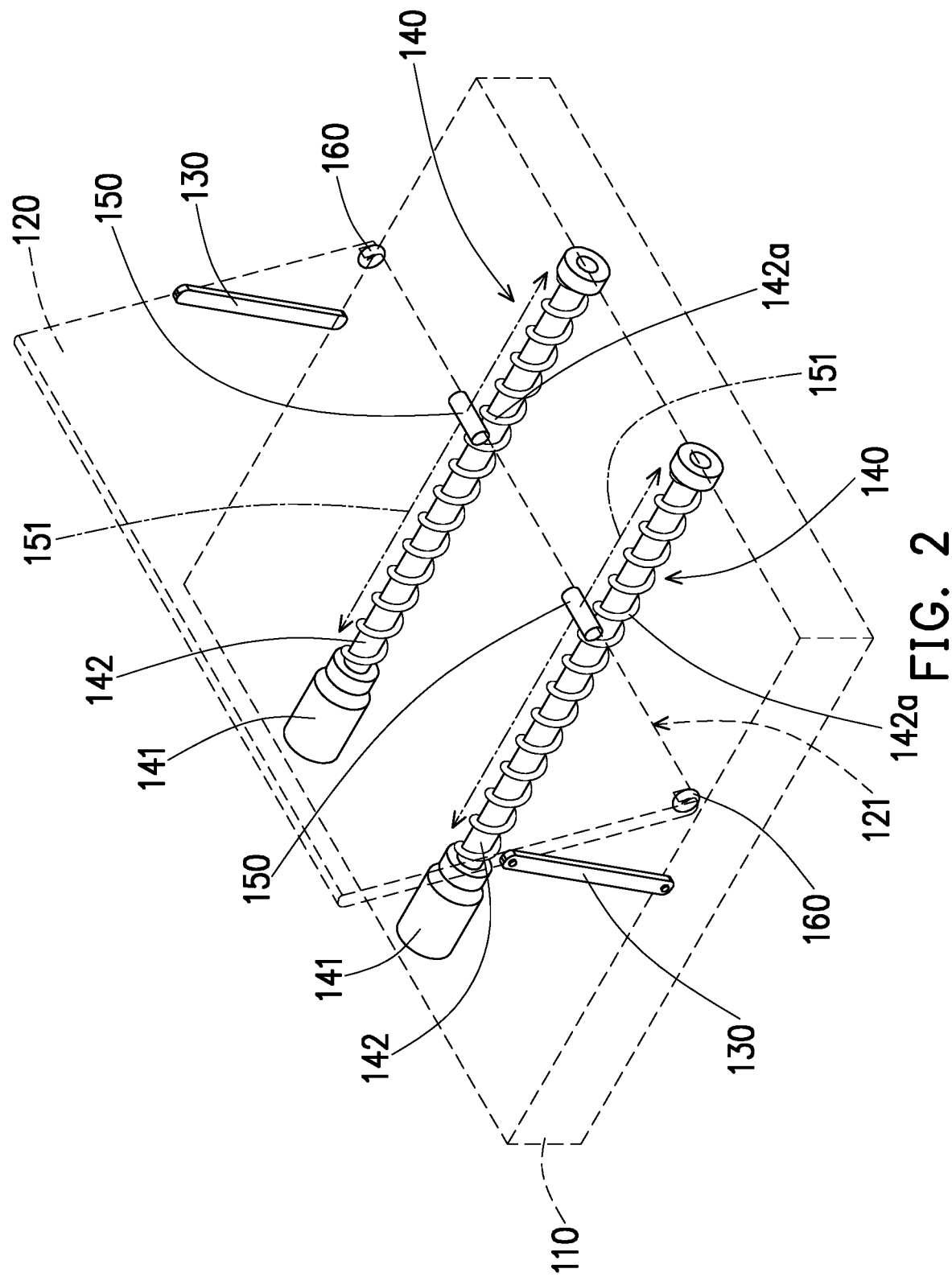
FIG. 2 is a schematic diagram of the portable electronic device in the raised state according to the second embodiment of the present invention.

FIG. 2 is a schematic diagram of the portable electronic device in the raised state according to the second embodiment of the present invention. In the drawings, the first body 110 and the second body 120 are drawn with dotted lines to clearly show the driving source 140 disposed inside the first body 110. Referring to FIG. 2, the design principles of the portable electronic device 100A of the embodiment are substantially the same as those of the portable electronic device 100 of the first embodiment. The difference between the two is that in this embodiment, the portable electronic device 100A includes two driving sources 140, and the two driving sources 140 are symmetrically disposed in the first body 110. Correspondingly, the number of the magnetic driven components 150 is also two, and they are respectively arranged corresponding to the two driving sources 140.

Further, the two magnetic driven components 150 are symmetrically disposed on the side 121 of the second body 120. And the two magnetic driven components 150 are magnetically attracted to the two magnetic screw thread portions 142a of the two screw rods 142 in the two driving sources 140, respectively. In the embodiment, the two sliding paths 151 of the two magnetic driven components 150 on the first body 110 overlap with the two screw rods 142 respectively to provide more stable guiding mechanism. Therefore, the above configuration not only helps to improve the stability of the second body 120 and the stand 130 when they are automatically raised and lowered relative to the first body 110, it also helps to increase the power required when the second body 120 and the stand 130 are automatically raised and lowered relative to the first body 110.

Figure 3:
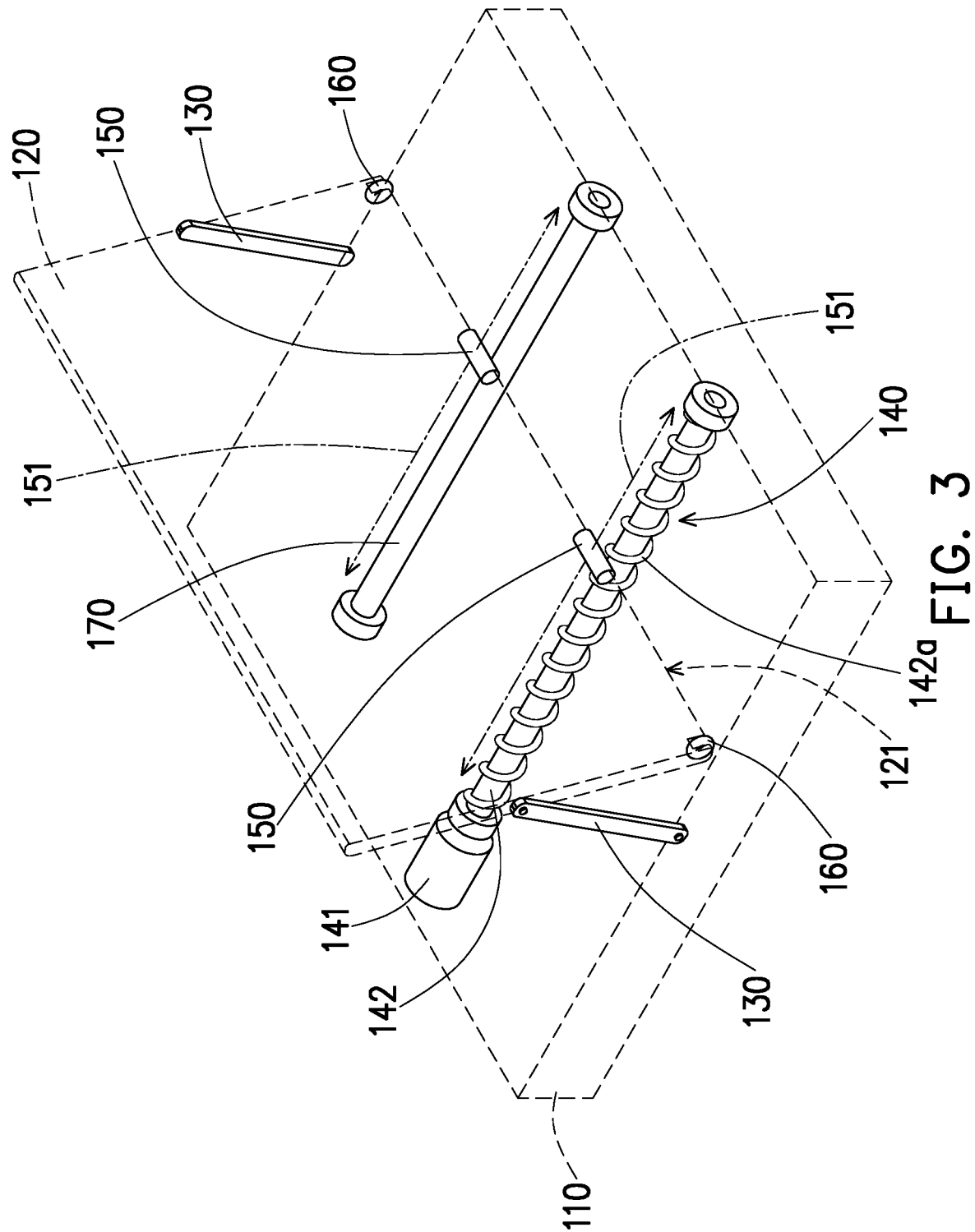
FIG. 3 is a schematic diagram of the portable electronic device in the raised state according to the third embodiment of the present invention.

FIG. 3 is a schematic diagram of the portable electronic device in the raised state according to the third embodiment of the present invention. In the drawings, the first body 110 and the second body 120 are drawn with dotted lines to clearly show the driving source 140 and the magnetic guide rod 170 disposed inside the first body 110. Referring to FIG. 3, the design principles of the portable electronic device 100B of the embodiment and the portable electronic device 100 of the first embodiment are substantially the same. The difference between the two is that the portable electronic device 100B includes a magnetic guide rod 170, and the magnetic guide rod 170 is disposed in the first body 110 in the embodiment.

The magnetic guide rod 170 is located on one side of the driving source 140 and is parallel to the screw rod 142 in the driving source 140. On the other hand, the number of the magnetic driven components 150 is two, which are respectively disposed corresponding to the screw rod 142 and the magnetic guide rod 170. Further, the two magnetic driven components 150 are symmetrically disposed on the side 121 of the second body 120, and the two magnetic driven components 150 are magnetically attracted to the screw rod 142 and the magnetic guide rod 170 respectively. In the embodiment, a sliding path 151 of the magnetic driven component 150 on the first body 110 overlaps the screw rod 142. And the sliding path 151 of the other magnetic driven component 150 on the first body 110 overlaps with the magnetic guide rod 170 to provide more stable guiding mechanism. Therefore, the above configuration helps to improve the stability when the second body 120 and the stand 130 are automatically raised and lowered relative to the first body 110.

To sum up, the portable electronic device of the present invention integrates an automatic lifting mechanism to drive the second body and the stand to raise or lower relative to the first body synchronously, so it has excellent operational convenience. In detail, the driving source is arranged in the first body, wherein the magnetic driven component is arranged on the side of the second body and is magnetically attracted to the driving source. When the driving source outputs power, the driving source drives the magnetic driven component to slide on the first body. On the other hand, the second body moves synchronously with the magnetic driven component, and drives the stand to rotate relative to the first body, so as to automatically switch the operation mode or viewing mode of the portable electronic device.

Although the present application has been disclosed as above with embodiments, it is not intended to limit the present application, any person with ordinary knowledge in the technical field, without departing from the spirit and scope of the present application, can make some changes. Therefore, the protection scope of the present application shall be determined by the scope of the claims.

What is claimed is:

1. A portable electronic device, comprising:
   a first body;
   a driving source, disposed in the first body and includes a motor and a screw rod coupled to the motor, and the screw has a magnetic screw thread portion;
   a stand, pivoted to the first body;
   a second body, pivoted to the stand; and
   a magnetic driven component, disposed at a side of the second body and the magnetic driven component is magnetically attracted to the magnetic screw thread portion of the screw rod,
   the motor drives the screw rod to rotate and the magnetic screw thread portion drives the magnetic driven component slide on the first body, the second body and the magnetic driven component move synchronously and drive the stand rotate with respect to the first body.

2. The portable electronic device according to claim 1, wherein the magnetic driven component contacts the first body.

3. The portable electronic device according to claim 1, wherein the number of the driving source and the number of the magnetic driven component are two, and the two driving sources are symmetrically arranged in the first body, the two magnetic driven components are symmetrically arranged on the side of the second body and are magnetically attracted to the two magnetic screw thread portions of the two screw rods in the two driving sources respectively.

4. The portable electronic device according to claim 1, further comprises:
   a magnetic guide rod, arranged in the first body and located on one side of the driving source, the number of the magnetic driven component is two, one of the magnetic driven components is magnetically attracted to the magnetic screw thread portion of the screw rod, and the other magnetic driven component is magnetically attracted to the magnetic guide rod.

5. The portable electronic device according to claim 4, wherein the screw rod and the magnetic guide rod are parallel to each other.

6. The portable electronic device according to claim 4, wherein the sliding path of one of the magnetic driven components on the first body overlaps the screw, and the slide path of the other magnetic driven component on the first body overlaps the magnetic guide rod.

7. The portable electronic device according to claim 1, wherein the slide path of magnetic driven component on the first body overlaps the screw rod.

8. The portable electronic device according to claim 1, wherein the material of the magnetic screw thread portion includes magnets, and the material of the magnetic driven component includes magnetic materials.

9. The portable electronic device according to claim 1, wherein the material of the magnetic screw thread portion includes magnetic materials, and the material of the magnetic driven component includes magnets.

10. The portable electronic device according to claim 1, further comprises:
    a guide wheel, arranged on the side of the second body and contacted the first body.

* * * * *